(12) United States Patent
Patukuri et al.

(10) Patent No.: US 10,078,134 B2
(45) Date of Patent: Sep. 18, 2018

(54) ADC DESIGN FOR DIFFERENTIAL AND COMMON MODE SIGNALS

(71) Applicant: Texas Instruments Incorporated, Dallas, TX (US)

(72) Inventors: Raja Reddy Patukuri, Nizamabad (IN); Jagannathan Venkataraman, Bangalore (IN); Prabu Sankar Thirugnanam, Chennai (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 355 days.

(21) Appl. No.: 14/852,104

(22) Filed: Sep. 11, 2015

(65) Prior Publication Data

US 2016/0329906 A1 Nov. 10, 2016

(30) Foreign Application Priority Data

May 6, 2015 (IN) ............................ 2302/CHE/2015

(51) Int. Cl.
*G01S 7/486* (2006.01)
*G01S 17/89* (2006.01)
*H03M 1/00* (2006.01)

(52) U.S. Cl.
CPC .......... *G01S 7/4865* (2013.01); *G01S 7/4863* (2013.01); *G01S 17/89* (2013.01); *H03M 1/00* (2013.01)

(58) Field of Classification Search
CPC .................................................. G01S 7/4865
See application file for complete search history.

(56) References Cited

U.S. PATENT DOCUMENTS

| 5,880,690 A * | 3/1999 | Rothenberg ........ H03M 1/0682 330/258 |
| 6,522,395 B1 * | 2/2003 | Bamji ...................... G01C 3/08 348/E3.018 |
| 2006/0157643 A1 * | 7/2006 | Bamji ...................... G01C 3/06 250/208.1 |
| 2011/0279148 A1 | 11/2011 | Watanabe |
| 2013/0214944 A1 | 8/2013 | Kosic |

FOREIGN PATENT DOCUMENTS

WO WO2015046735 2/2015

OTHER PUBLICATIONS

International Search Report for corresponding PCT Application No. PCT/US2016/031149, dated Aug. 25, 2016, (2 pages).
Supplementary European Search Report in corresponding European Patent Application No. 16790141.2, dated Apr. 3, 2018.
Shih, et al., "A Fully Differential Comparator Using a Switched-Capacitor Differencing Circuit with Common-Mode Rejection," IEEE Journal of Solid-State Circuits, IEEE Service Center, Piscataway, NJ, USA, vol. 32, No. 2, Feb. 1, 1997 (Feb. 1, 1997) XP011060418, ISSN: 0018-9200 (4 pages).

\* cited by examiner

*Primary Examiner* — Eric L Bolda
(74) *Attorney, Agent, or Firm* — John R. Pessetto; Charles A. Brill; Frank D. Cimino

(57) ABSTRACT

The disclosure provides a circuit. The circuit includes a first analog to digital converter (ADC) that generates a coarse output in response to a first input and a second input. The first ADC generates the coarse output in a differential phase. A pipeline ADC generates a differential signal in response to the coarse output, the first input and the second input. The pipeline ADC generates the differential signal in a common-mode phase. The first ADC generates a common mode signal in the common-mode phase.

20 Claims, 7 Drawing Sheets

ADC DESIGN FOR DIFFERENTIAL AND COMMON MODE SIGNALS

CROSS REFERENCES TO RELATED APPLICATIONS

This application claims priority from India provisional patent application No. 2302/CHE/2015 filed on May 6, 2015 which is hereby incorporated by reference in its entirety.

TECHNICAL FIELD

The present disclosure is generally related to electronic circuits, and more particularly to an analog to digital converter (ADC) design for differential and common mode signals generated in a time-of-flight (TOF) system.

BACKGROUND

An emerging category of electronic devices is time-of-flight (TOF) systems. The TOF systems find applications in accelerometers, monolithic gyroscopes, light sensors, conveyor belts, depth sensing, proximity sensing, gesture recognition and imagers. A TOF system includes a light source that emits light pulses. The light pulses are emitted towards a target, which reflects the light pulses. The target is any object of interest which may include, but not limited to, a human, an automated component, an animal, an electronic device etc. A TOF sensor in the TOF system receives the reflected light pulses. The TOF sensor receives the reflected light pulses after a time-of-flight, which is proportional to a distance of the target from the TOF system.

The TOF sensor includes a pixel array having a plurality of pixels. The pixel array receives the reflected light pulses. The pixel array collects light for a predetermined amount of time after the emission of the light by the light source. Light reflected from a far away object travels a longer distance and therefore has a longer time-of-flight, whereas light reflected from a nearby object is received after short time-of-flight. Each pixel in the pixel array generates two outputs. These two outputs are not purely differential. A common mode signal obtained from these two outputs provides information about a level of ambient light. A differential signal obtained from these two outputs provides information about a depth of the target.

Both common mode signal and differential signal are converted to digital signals using analog to digital converters (ADCs). As resolution requirement increases, a power required to drive an ADC increases proportionately, and an area required by the ADC also increases proportionately. Thus, the ADCs take a significant area of a TOF system. Also, when multiple ADCs are used in the TOF system, a large power is required to drive these ADCs.

SUMMARY

According to an aspect of the disclosure, a circuit is disclosed. The circuit includes a first analog to digital converter (ADC) that generates a coarse output in response to a first input and a second input. The first ADC generates the coarse output in a differential phase. A pipeline ADC generates a differential signal in response to the coarse output, the first input and the second input. The pipeline ADC generates the differential signal in a common-mode phase. The first ADC generates a common mode signal in the common-mode phase.

BRIEF DESCRIPTION OF THE VIEWS OF DRAWINGS

Figure 1:
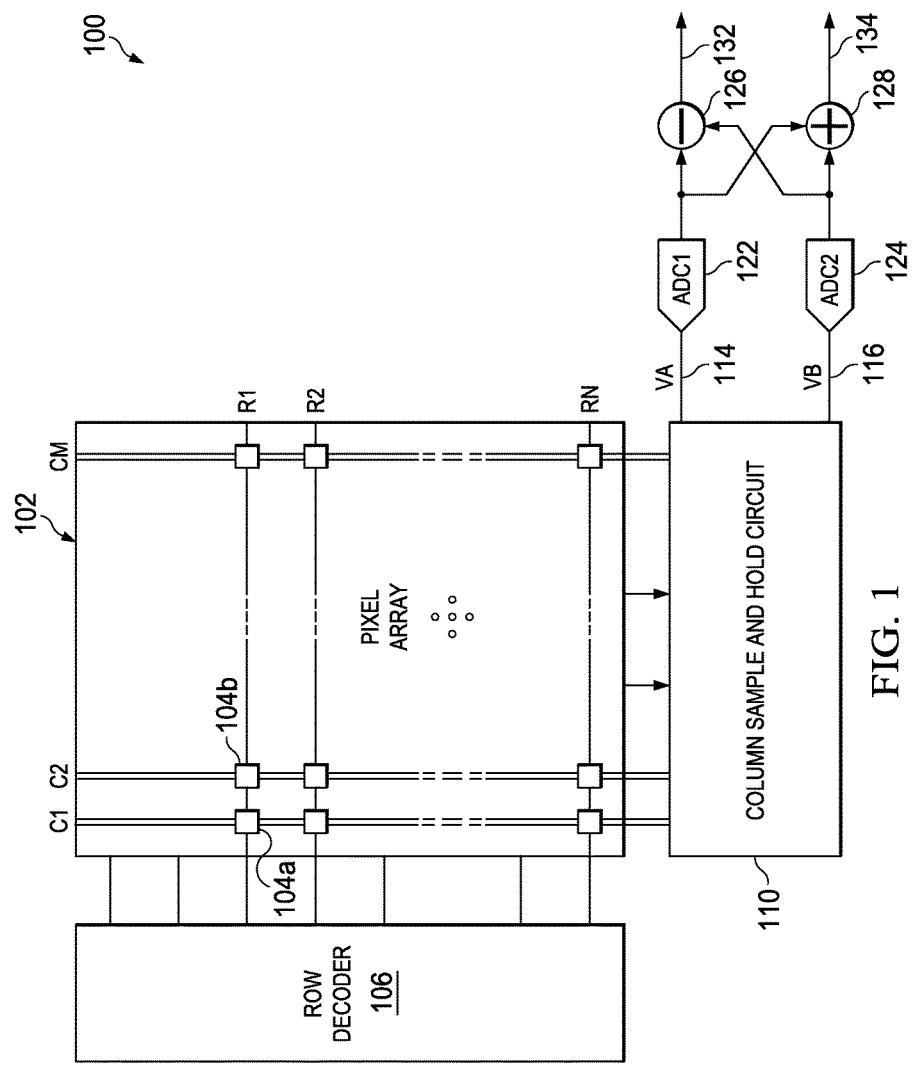
Figure 2:
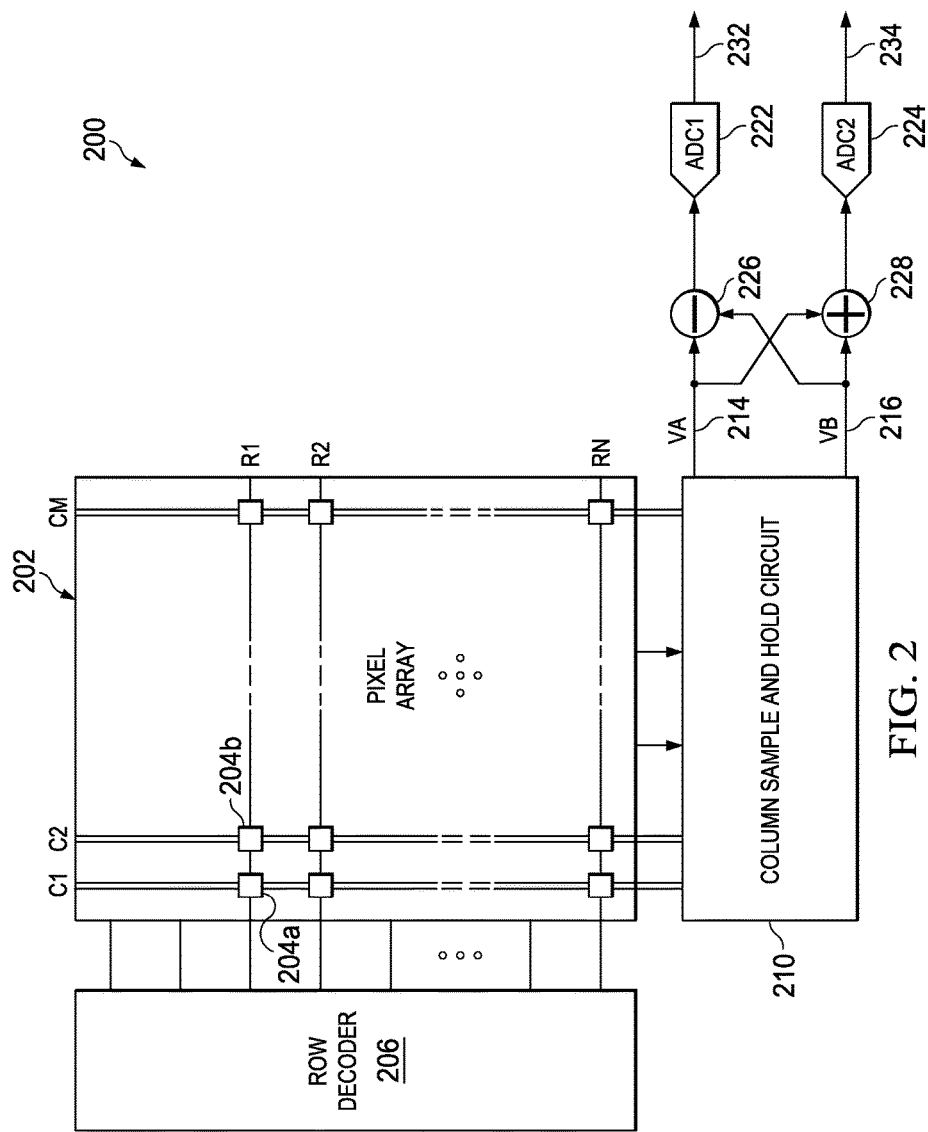
Figure 3:
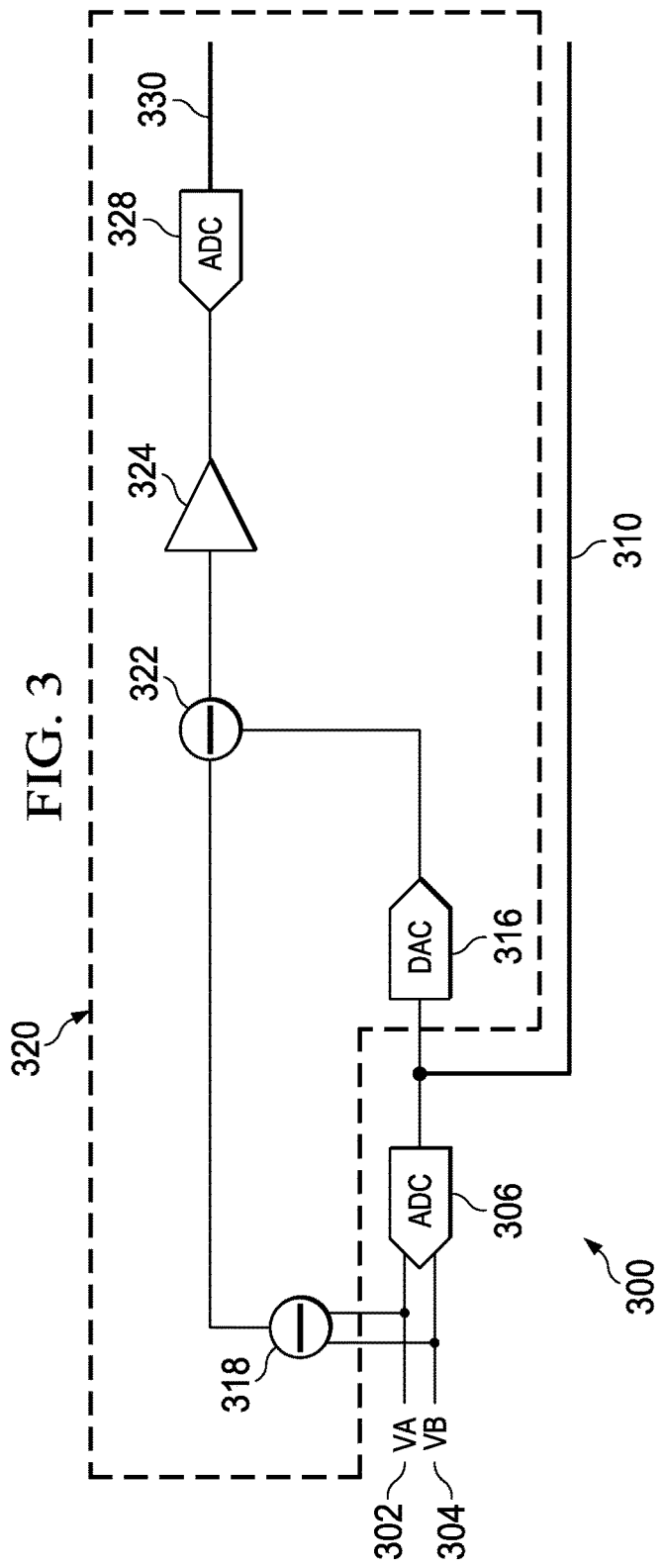
Figure 4:
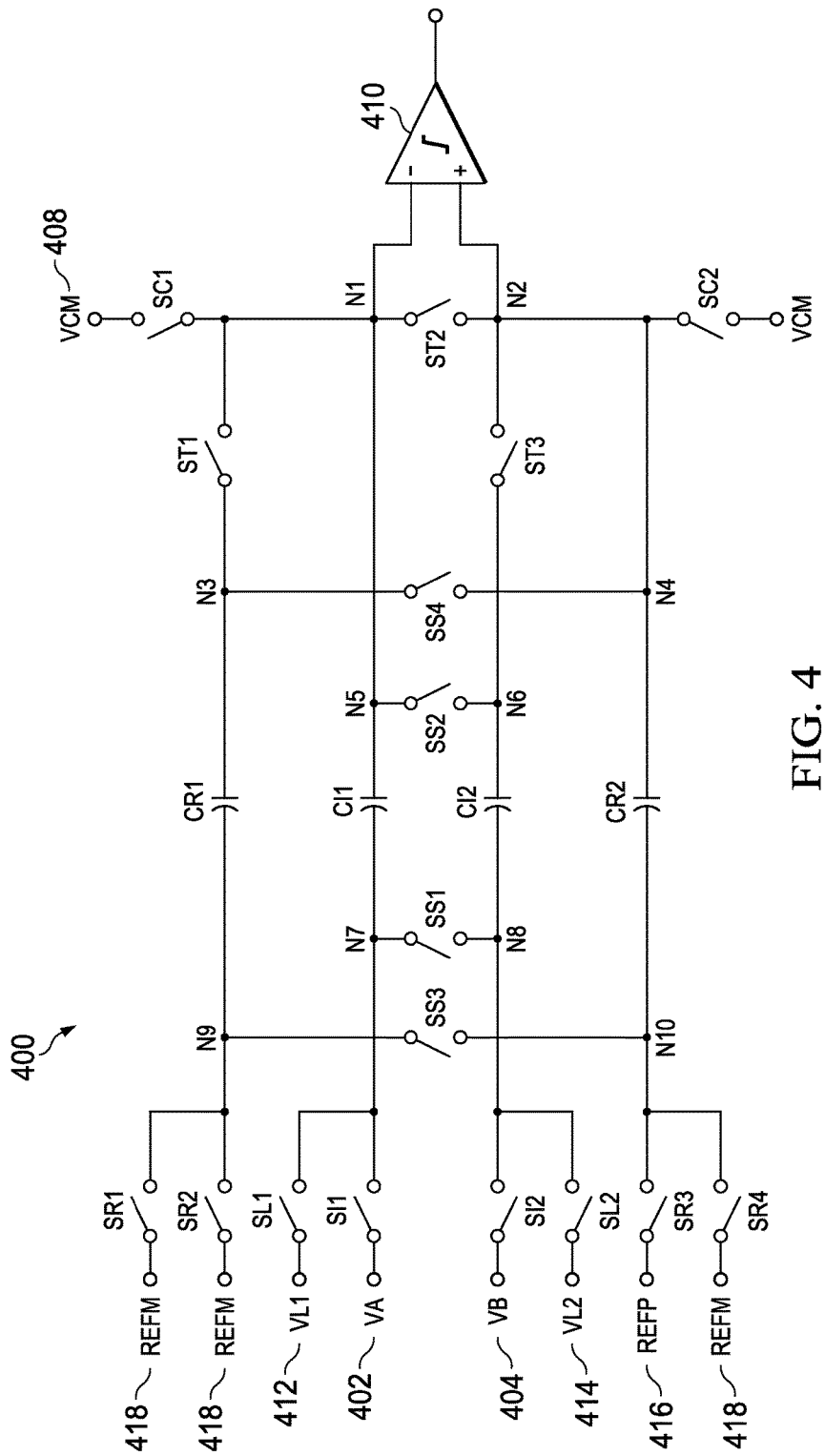
Figure 5:
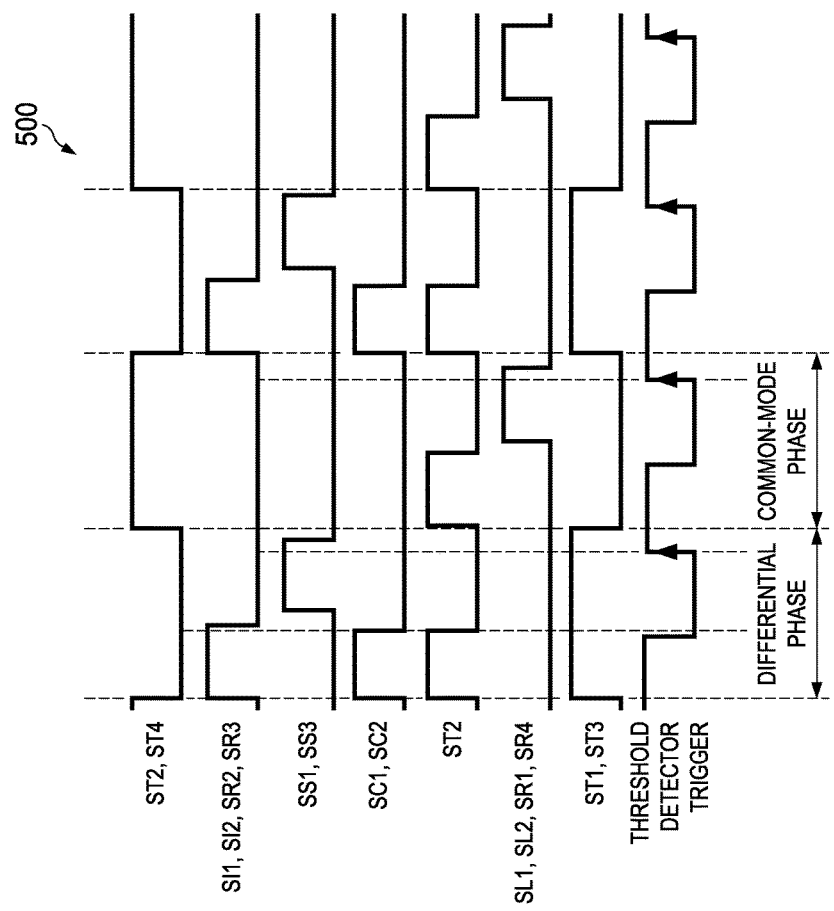
Figure 6:
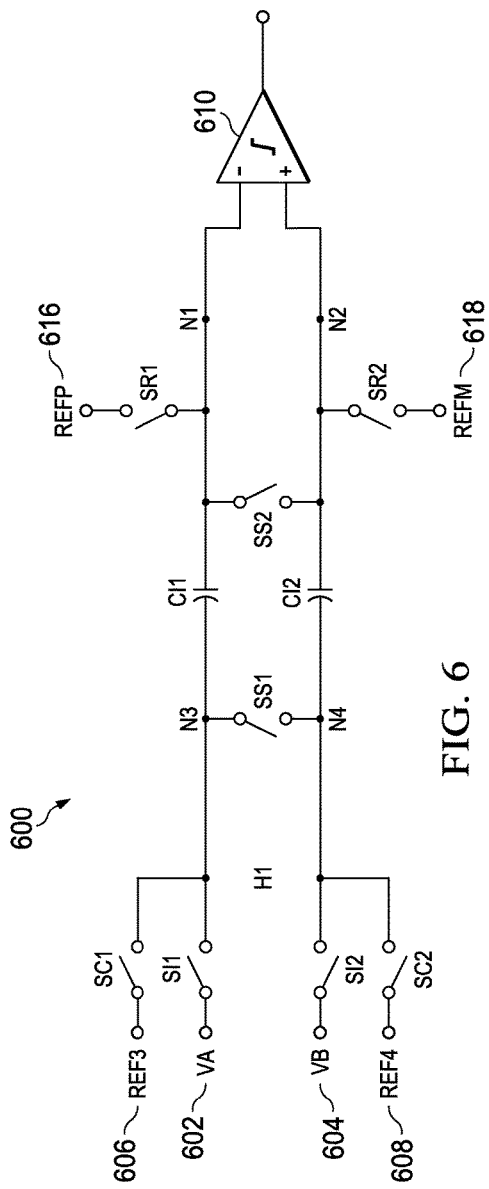
Figure 7:
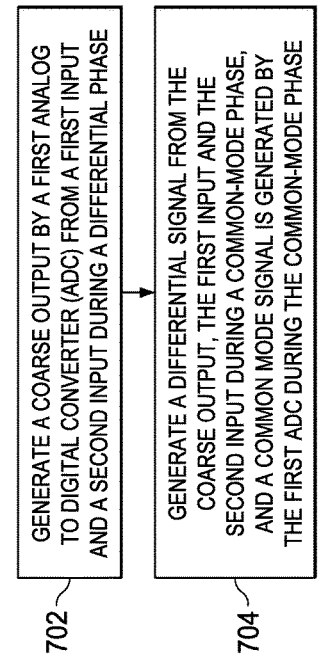
Figure 8:
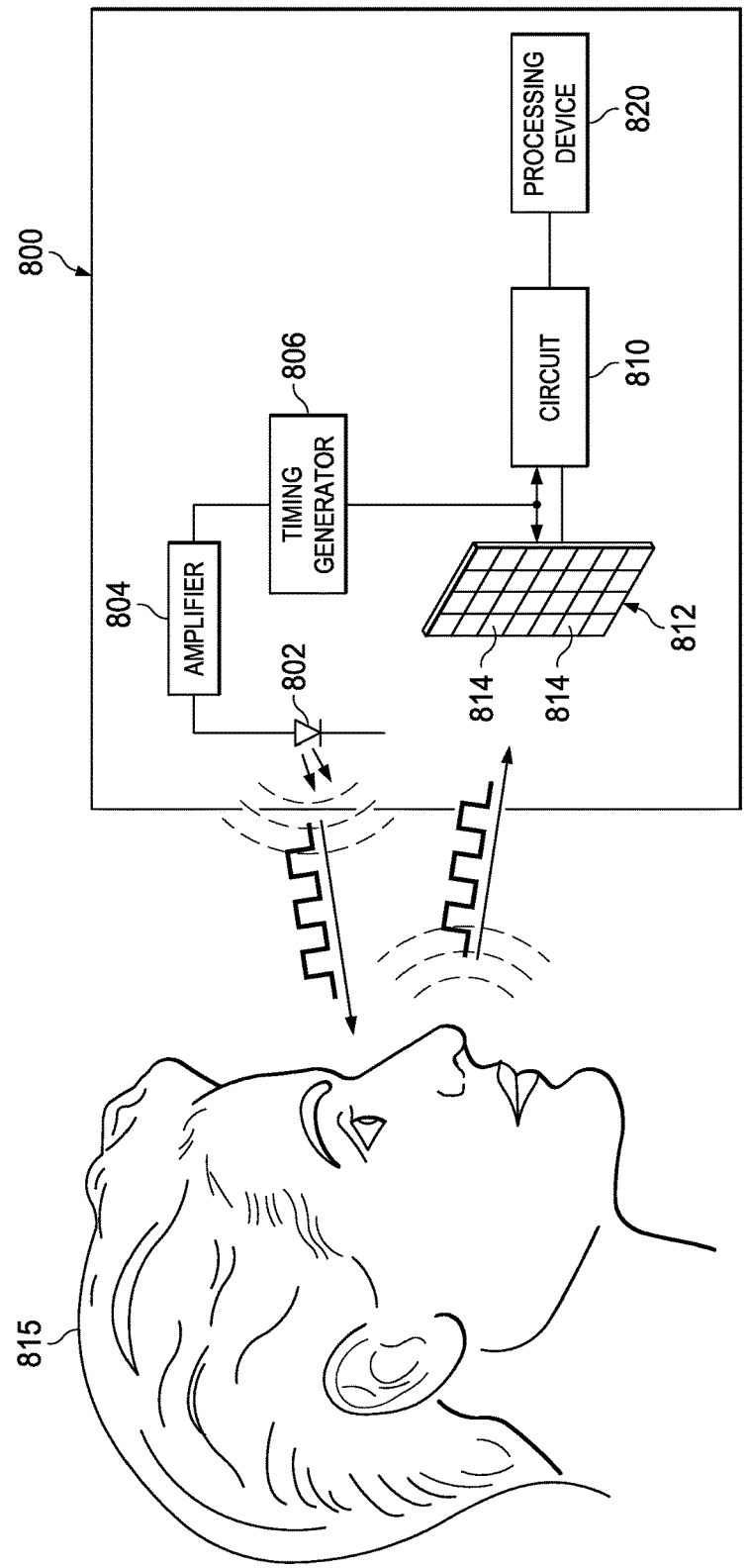

FIG. 1 illustrates a circuit;
FIG. 2 illustrates a circuit, according to an embodiment;
FIG. 3 illustrates a circuit, according to an embodiment;
FIG. 4 illustrates a comparator, according to an embodiment;
FIG. 5 illustrates a timing diagram of a comparator, according to an embodiment;
FIG. 6 illustrates a comparator, according to an embodiment;
FIG. 7 is a flowchart to illustrate a method of operation of a circuit, according to an embodiment; and
FIG. 8 illustrates a time-of-flight (TOF) system, according to an embodiment.

DETAILED DESCRIPTION OF THE EMBODIMENTS

FIG. 1 illustrates a circuit 100. The circuit 100 includes a pixel array 102, a row decoder 106 and a column sample and hold circuit 110. The pixel array 102 includes a plurality of pixels illustrated as 104a and 104b. The plurality of pixels arranged in a plurality of rows and a plurality of columns. The pixel array 102 is illustrated to have N rows represented as R1, R2 to RN, and M columns represented as C1, C2 to CM. M and N are positive integers greater than or equal to one. The row decoder 106 and the column sample and hold circuit 110 are coupled to the pixel array 102.

The circuit 100 further includes a first analog to digital converter (ADC1) 122 and a second ADC (ADC2) 124. The ADC1 122 and the ADC2 124 are coupled to the column sample and hold circuit 110. A subtractor 126 and an adder 128 are coupled to the ADC1 122 and the ADC2 124.

The operation of the circuit 100 illustrated in FIG. 1 is explained now. Each pixel in the pixel array 102 is charged to a reset voltage level. A light source emits light pulses which are reflected by a target. The pixel array 102 receives light pulses reflected by the target. When the pixel array 102 receives the light pulses, the plurality of pixels in the pixel array 102 discharge from reset voltage levels. The pixels discharge and attain a voltage lower than the reset voltage based on the intensity of the light pulses and exposure time of the pixel array 102 to the light pulses.

The row decoder 106 activates a row of the plurality of rows in the pixel array 102. For example, row R1 is activated by the row decoder 106. The voltages stored in all the pixels in the row R1 is transferred to the column sample and hold circuit 110. The column sample and hold circuit 110 activates a column of the plurality of columns in the pixel array 102. For each light pulse received by the pixel array 102, each pixel in the pixel array 102 generates two voltages.

For example, when row R1 is activated by the row decoder 106, the column sample and hold circuit 110 provides voltages corresponding to each pixel of row R1. These steps are repeated for all the pixels in the pixel array 102. The column sample and hold circuit 110 generates a first input VA 114 and a second input VB 116. The first input VA 114 and the second input VB 116 are voltages generated by the column sample and hold circuit 110 corresponding to a pixel of the plurality of pixels in the pixel array 102. For example, the first input VA 114 and the second input VB 116 corresponds to the voltages generated by the pixel 104a in response to a light pulse.

The ADC1 122 receives the first input VA 114, and the ADC2 124 receives the second input VB 116. The subtractor 126 subtracts an output of the ADC2 124 from an output of the ADC1 122 to generate a differential signal 132. The adder 128 sums the output of the ADC2 124 and the output of the ADC1 122 to generate a common mode signal 134. The differential signal 132 is proportional to a difference in the first input VA 114 and the second input VB 116. The common mode signal 134 is proportional to a sum of the first input VA 114 and the second input VB 116.

The circuit 100 utilizes two analog to digital converters, ADC1 122 and ADC2 124. In one example, both the ADC1 122 and ADC2 124 are of 12 bit resolution. Thus, power and area consumption of each ADC in the circuit 100 is large. Also, a low resolution common mode signal and a high resolution differential signal is suitable for a time-of-flight (TOF) system. However, in the circuit 100 both the common mode signal 134 and the differential signal 132 are of high resolution.

FIG. 2 illustrates a circuit 200, according to an embodiment. The circuit 200 includes a pixel array 202, a row decoder 206 and a column sample and hold circuit 210. The pixel array 202 includes a plurality of pixels illustrated as 204a and 204b. The plurality of pixels arranged in a plurality of rows and a plurality of columns. The pixel array 202 is illustrated to have N rows represented as R1, R2 to RN, and M columns represented as C1, C2 to CM. M and N are positive integers greater than or equal to one. The row decoder 206 and the column sample and hold circuit 210 are coupled to the pixel array 202.

The circuit 200 further includes a subtractor 226, an adder 228, a first analog to digital converter (ADC1) 222 and a second ADC (ADC2) 224. The subtractor 226 and the adder 228 are coupled to the column sample and hold circuit 210. The ADC1 222 is coupled to the subtractor 226, and the ADC2 224 is coupled to the adder 228.

The operation of the circuit 200 illustrated in FIG. 2 is explained now. Each pixel in the pixel array 202 is charged to a reset voltage level. A light source emits light pulses which are reflected by a target. The pixel array 202 receives light pulses reflected by the target. When the pixel array 202 receives the light pulses, the plurality of pixels in the pixel array 202 discharge from reset voltage levels. The pixels discharge and attain a voltage lower than the reset voltage based on the intensity of the light pulses and exposure time of the pixel array 202 to the light pulses.

The row decoder 206 activates a row of the plurality of rows in the pixel array 202. For example, row R1 is activated by the row decoder 206. The voltages stored in all the pixels in the row R1 is transferred to the column sample and hold circuit 210. The column sample and hold circuit 210 activates a column of the plurality of columns in the pixel array 202. For each light pulse received by the pixel array 202, each pixel in the pixel array 202 generates two voltages.

For example, when row R1 is activated by the row decoder 206, the column sample and hold circuit 210 provides voltages corresponding to each pixel of row R1. These steps are repeated for all the pixels in the pixel array 202. The column sample and hold circuit 210 generates a first input VA 214 and a second input VB 216. The first input VA 214 and the second input VB 216 are voltages generated by the column sample and hold circuit 210 corresponding to a pixel of the plurality of pixels in the pixel array 202. For example, the first input VA 214 and the second input VB 216 corresponds to the voltages generated by the pixel 204a in response to a light pulse.

The adder 228 sums the first input VA 214 and the second input VB 216 to generate a first analog signal. The subtractor 226 subtracts the second input VB 216 from the first input VA 214 to generate a second analog signal. In one version, the subtractor 226 subtracts the first input VA 214 from the second input VB 216 to generate the second analog signal. The ADC2 224 generates a common mode signal 234 in response to the first analog signal. In one version, the ADC2 224 is a flash ADC. The ADC1 222 generates a differential signal 232 in response to the second analog signal. In one example, the ADC1 222 is implemented as a pipeline ADC or SAR (successive approximation register) ADC. The pipeline ADC, in one example, includes a flash ADC for coarse conversion followed by a SAR ADC for fine conversion.

The differential signal 232 is proportional to a difference in the first input VA 214 and the second input VB 216. The common mode signal 234 is proportional to a sum of the first input VA 214 and the second input VB 216. The circuit 200 has reduced power and area requirement as compared to the circuit 100. In one example, the ADC1 222 is of 12 bit resolution and the ADC2 224 is of 4 bit resolution. Thus, the differential signal 232 generated by the ADC1 222 is of high resolution, and the common mode signal 234 generated by the ADC2 224 is of low resolution. Thus, circuit 200 finds application in TOF systems.

FIG. 3 illustrates a circuit 300, according to an embodiment. The circuit 300 includes a first analog to digital converter (ADC) 306 and a pipeline analog to digital converter (ADC) 320. The first ADC 306 receives a first input VA 302 and a second input VB 304. In one version, the circuit 300 is part of a time-of-flight (TOF) system. In another version, the circuit 300 includes a pixel array, a row decoder and a column sample and hold circuit similar to circuit 200 (illustrated in FIG. 2). The column sample and hold circuit provides the first input VA 302 and the second input VB 304 to the first ADC 306.

In one example, the first input VA 302 and the second input VB 304 corresponds to a voltages generated by a pixel in the pixel array in response to a light pulse. The pipeline ADC 320 is coupled to the first ADC 306. The pipeline ADC 320 includes a digital to analog converter (DAC) 316, a first subtractor 318, a second subtractor 322, an amplifier 324 and a second ADC 328. The DAC 316 is coupled to the first ADC 306. The first subtractor 318 receives the first input VA 302 and the second input VB 304.

The second subtractor 322 is coupled to the first subtractor 318 and the DAC 316. The amplifier 324 is coupled to the second subtractor 322. The second ADC 328 is coupled to the amplifier 324. The circuit 300 may include one or more additional components known to those skilled in the relevant art and are not discussed here for simplicity of the description.

The operation of the circuit 300, illustrated in FIG. 3 is explained now. The circuit 300 operates in a differential phase and a common-mode phase. In the differential phase, the first ADC 306 generates a coarse output in response to the first input VA 302 and the second input VB 304. In one example, the coarse output is proportional to a difference in the first input VA 302 and the second input VB 304. In the common-mode phase, the pipeline ADC 320 generates a differential signal 330 in response to the coarse output, the first input VA 302 and the second input VB 304. Also, in the common-mode phase, the first ADC 306 generates a common mode signal 310.

In the common-mode phase, the pipeline ADC 320 receives the coarse output, the first input VA 302 and the second input VB 304, and generates the differential signal 330 in response to the coarse output, the first input VA 302 and the second input VB 304. The differential signal 330 is proportional to a difference in the first input VA 302 and the second input VB 304. The common mode signal 310 is proportional to a sum of the first input VA 302 and the second input VB 304.

In the common-mode phase, the DAC 316 in the pipeline ADC 320 receives the coarse output, and generates a first analog signal. The first subtractor 318 subtracts the second input VB 304 from the first input VA 302 to generate a second analog signal. In one version, the first subtractor 318 subtracts the first input VA 302 from the second input VB 304 to generate the second analog signal. The second subtractor 322 subtracts the first analog signal from the second analog signal to generate a residue signal. In one example, the second subtractor 322 subtracts the second analog signal from the first analog signal to generate the residue signal. The amplifier 324 amplifies the residue signal to generate an amplified residue signal. The second ADC 328 generates the differential signal 330 in response to the amplified residue signal.

The first ADC 306 includes a plurality of comparators. During the differential phase, a comparator of the plurality of comparators compares a difference in the first input VA 302 and the second input VB 304 with a resultant reference voltage. The resultant reference voltage is measured using a first reference voltage and a second reference voltage. During the common-mode phase, a comparator of the plurality of comparators compares a sum of the first input VA 302 and the second input VB 304 with the resultant reference voltage.

Thus, in the circuit 300, the first ADC 306 generates the coarse output in the differential phase. This coarse output is used by the pipeline ADC 320 to generate the differential signal 330 during the common-mode phase. The common-mode phase is used by the first ADC 306 to generate the common mode signal 310. Thus, the common mode signal 310 is generated within a time frame used for generating the differential signal 330. In one version, the common mode signal 310 is generated by the first ADC 306 before the pipeline ADC 320 generates the differential signal 330.

The circuit 300 uses the first ADC 306 to generate both the differential signal 330 and the common mode signal 310. Hence, circuit 300 requires very less power and area as compared to the circuit 100. In one example, the differential signal 330 generated by the pipeline ADC 320 is of high resolution, and the common mode signal 310 generated by the first ADC 306 is of low resolution which makes it compatible to use for TOF systems.

FIG. 4 illustrates a comparator 400, according to an embodiment. The comparator 400, in one example, is a comparator of the plurality of comparators in the first ADC 306. The first ADC 306 may include one or more comparators similar to comparator 400. The comparator 400 receives a first input VA 402, a second input VB 404, a first level shift voltage VL1 412 and a second level shift voltage VL2 414. The comparator 400 also receives a first reference voltage REFP 416 and a second reference voltage REFM 418. The first input VA 402 and the second input VB 404 are similar to the first input VA 302 and the second input VB 304 respectively.

The comparator 400 also includes a set of input capacitors represented as CI1 and CI2, and a set of reference capacitors represented as CR1 and CR2. In one example, a capacitance of CI1 and CI2 is equal, and a capacitance of CR1 and CR2 are equal. The comparator 400 also includes a set of input switches represented as SI1 and SI2, a set of level-shift switches represented as SL1 and SL2, a set of reference switches represented as SR1, SR2, SR3 and SR4, a set of first shorting switches represented as SS1 and SS2 and a set of second shorting switches represented as SS3 and SS4. The comparator 400 also includes a set of terminal switches represented as ST1, ST2 and ST3, and a set of common switches represented as SC1 and SC2.

The input switch SI1 receives the first input VA 402, and the input switch SI2 receives the second input VB 404. The set of input capacitors (CI1, CI2) are coupled to the set of input switches (SI1, SI2). The level-shift switch SL1 is coupled in parallel to the input switch SI1, and receives the first level shift voltage VL1 412. The level-shift switch SL2 is coupled in parallel to the input switch SI2, and receives the second level shift voltage VL2 414.

The reference switches SR1, SR2 and SR4 receives the second reference voltage REFM 418, and the reference switch SR3 receives the first reference voltage REFP 416. The reference capacitors (CR1, CR2) are coupled to the set of reference switches (SR1, SR2, SR3 and SR4). The first shorting switches (SS1, SS2) couple the set of input capacitors (CI1, CI2), and the set of second shorting switches (SS3, SS4) couple the set of reference capacitors (CR1, CR2). The set of common switches (SC1, SC2) receives a common mode voltage VCM 408. The set of terminal switches (ST1, ST2 and ST3) are coupled to the set of reference capacitors (CR1, CR2) and the set of input capacitors (CI1, CI2). The comparator 400 includes a threshold detector 410 that is coupled to the set of terminal switches (ST1, ST2 and ST3) and the set of common switches (SC1, SC2).

A first node N1 of the threshold detector 410 is coupled to a second node N2 of the threshold detector 410 through the terminal switch ST2. The common switch SC1 is coupled to the first node N1 and receives the common mode voltage VCM 408. The common switch SC2 is coupled to the second node N2 and receives the common mode voltage VCM 408. The reference capacitor CR1 is coupled to the terminal switch ST1 at a third node N3. The second shorting switch SS4 is coupled between the third node N3 and a fourth node N4. The second shorting switch SS3 is coupled between a ninth node N9 and a tenth node N10. The reference capacitor CR1 is coupled between the ninth node N9 and the third node N3. The reference capacitor CR2 is coupled between the tenth node N10 and the fourth node N4.

The first shorting switch SS2 is coupled between a fifth node N5 and a sixth node N6. The first shorting switch SS1 is coupled between a seventh node N7 and an eighth node N8. The input capacitor CI1 is coupled between the seventh node N7 and the fifth node N5. The input capacitor CI2 is coupled between the eighth node N8 and the sixth node N6. The input switch SI1 is coupled to the seventh node N7 and receives the first input VA 402. The input switch SI2 is coupled to the eighth node N8 and receives the second input VB 404. The level-shift switch SL1 is coupled to the seventh node N7 and receives the first level shift voltage VL1 412. The level-shift switch SL2 is coupled to the eighth node N8 and receives the second level shift voltage VL2 414.

Each of the reference switch SR1 and the reference switch SR2 are coupled to the ninth node, and receives the second reference voltage REFM 418. The reference switch SR3 is coupled to the tenth node N10 and receives the first reference voltage REFP 416. The reference switch SR4 is coupled to the tenth node N10 and receives the second reference voltage REFM 418. The comparator 400 is one of the many ways of implementing a comparator and variations, and alternative constructions are apparent and well within the spirit and scope of the disclosure. The comparator 400 may include one or more additional components known to those skilled in the relevant art and are not discussed here for simplicity of the description.

The operation of the comparator 400 illustrated in FIG. 4 is explained now. The operation of the comparator is explained in connection with the operation of the first ADC 306 illustrated in FIG. 3. The first ADC 306 operates in the differential phase and the common-mode phase. The first ADC 306 includes one or more comparators similar to the comparator 400. Thus, the comparator 400 also operates in the differential phase and the common-mode phase.

The differential phase of the comparator 400 is explained now. The reference switches SR2 and SR3, and the input switches SI1 and SI2 are activated or closed. Thus, the first input VA 402 is sampled on a bottom side of the input capacitor CI1 which is coupled to the seventh node N7. The second input VB 404 is sampled on a bottom side of the input capacitor CI2 which is coupled to the eighth node N8. The first reference voltage REFP 416 is sampled on a bottom side of the reference capacitor CR2 which is coupled to the tenth node N10. The second reference voltage REFM 418 is sampled on a bottom side of the reference capacitor CR1 which is coupled to the ninth node N9.

Also, in the differential phase, the common switches SC1 and SC2, and the terminal switches ST1, ST2 and ST3 are activated. Thus, the common mode voltage VCM 408 is sampled on a top side of the input capacitors CI1, CI2 and the reference capacitors CR1 and CR2. Therefore, the third node N3, the fifth node N5, the sixth node N6 and the fourth node N4 are at the common mode voltage VCM 408. The voltages at different nodes of the comparator 400 is given as $$V_{N9} = REFM \qquad (1)$$

$$V_{N10} = REFP \qquad (2)$$

$$V_{N7} = VA \qquad (3)$$

$$V_{N8} = VB \qquad (4)$$

$$V_{N3} = V_{N5} = V_{N6} = V_{N4} = V_{N1} = V_{N2} = VCM \qquad (5)$$

where $V_{N9}$ is a voltage at the ninth node N9 and $V_{N10}$ is a voltage at the tenth node N10. Similarly, voltages at other nodes of the comparator 400 are defined in equation 1 to 5.

Thereafter, in the differential phase, the first shorting switch SS1 and the second shorting switch SS3 are activated. The terminal switches ST1 and ST3 are activated. The common switches SC1, SC2 and the terminal switch ST2 are inactivated. When the first shorting switch SS1 is activated, a voltage at the seventh node N7 and at the eighth node N8 are given as:

$$V_{N7} = V_{N8} = 0.5 * (VA + VB) \qquad (6)$$

Similarly, when the second shorting switch SS3 is activated, a voltage at the ninth node N9 and the tenth node N10 is given as:

$$V_{N9} = V_{N10} = 0.5 * (REFP + REFM) \qquad (7)$$

When the terminal switches ST1 and ST3 are activated and the common switches SC1, SC2 and the terminal switch ST2 are inactivated, a first voltage at the first node N1 is given as:

$$V_{N1} = \qquad (8)$$
$$VCM + 0.5 \times \left(\frac{VA + VB}{2} - VA\right) + 0.5 \times \left(\frac{REFP + REFM}{2} - REFM\right)$$

$$V_{N1} = VCM - 0.5 \times \left(\frac{VA - VB}{2}\right) + 0.5 \times \left(\frac{REFP - REFM}{2}\right) \qquad (9)$$

Similarly, a second voltage at the second node N2 is defined as:

$$V_{N2} = \qquad (10)$$
$$VCM + 0.5 \times \left(\frac{VA + VB}{2} - VB\right) + 0.5 \times \left(\frac{REFP + REFM}{2} - REFP\right)$$

$$V_{N2} = V_{CM} + 0.5 \times \left(\frac{VA - VB}{2}\right) - 0.5 \times \left(\frac{REFP - REFM}{2}\right) \qquad (11)$$

The threshold detector 410 compares the first voltage $V_{N1}$ at the first node N1 and the second voltage $V_{N2}$ at the second node N2 to generate a first digital output. The first digital output is generated by each comparator of plurality of comparators in the first ADC 306. The first digital output from each comparator of the plurality of comparators form the coarse output (similar to the coarse output generated by the first ADC 306).

The common-mode phase of the comparator 400 is explained now. The differential phase is followed by the common-mode phase. In the common-mode phase, the first shorting switch SS2 and the second shorting switch SS4 are activated. The activation of the first shorting switch SS2 shorts the top side of the input capacitors CI1 and CI2. The activation of the second shorting switch SS4 shorts the top side of the reference capacitors CR1 and CR2. Also, the terminal switch ST2 is activated. All other switches in the comparator 400 remains inactivated. This generates the common mode voltage VCM 408 at the first node N1 and the second node N2.

Thereafter, the reference switches SR1 and SR4, and level-shift switches SL1 and SL2 are activated, and the terminal switch ST2 is inactivated. Thus, the second reference voltage REFM 418 is provided to the bottom side of reference capacitors CR1 and CR2. Also, the first level-shift voltage VL1 412 is provided to the bottom side of the input capacitor CI1, and the second level-shift voltage VL2 414 is provided to the bottom side of the input capacitor CI2. Thus, a third voltage generated at the first node N1 is defined as:

$$V_{N1} = V_{CM} + 0.5 \times \left(LS1 - \frac{VA + VB}{2}\right) + 0.5 \times \left(LS2 - \frac{VA + VB}{2}\right) \qquad (12)$$

$$V_{N1} = V_{CM} + 0.5 \times (LS1 + LS2) - 0.5 \times \left(\frac{VA - VB}{2}\right) \qquad (13)$$

A fourth voltage generated at the second node N2 is defined as:

$$V_{N2} = V_{CM} + 0.5 \times \left(REFM - \frac{REFP + REFM}{2}\right) + \qquad (14)$$
$$0.5 \times \left(REFM - \frac{REFP + REFM}{2}\right)$$

$$V_{N2} = V_{CM} - 0.5 \times (REFP - REFM) \qquad (15)$$

The threshold detector 410 compares the third voltage generated at the first node N1 and the fourth voltage generated at the second node N2 to generate a second digital output. The second digital output is generated by each comparator of plurality of comparators in the first ADC 306. The second digital output from each comparator of the plurality of comparators form the common mode signal (similar to the common mode signal 310 generated by the first ADC 306).

Thus, with the use of the comparator 400 in the first ADC 306, the circuit 300 is able to generate both the differential signal 330 and the common mode signal 310 using the first ADC 306. The circuit 300 does not require any additional ADC to generate the common mode signal. This reduces an input sampling capacitor of the circuit 300. Also, the circuit 300 requires very less power and area as compared to the circuit 100. The comparator 400 provides a solution for using the first ADC 306 to generate the common mode signal 310, and the common mode signal 310 is generated during the common-mode phase when the pipeline ADC 320 is generating the differential signal 330.

FIG. 5 illustrates a timing diagram 500 of a comparator, according to an embodiment. The timing diagram is explained in connection with the comparator 400. In the differential phase, the reference switches SR2 and SR3, and the input switches SI1 and SI2 are activated or closed. The first input VA 402 and the second input VB 404 is sampled on a bottom side of the set of input capacitors CI1 and CI2 respectively. The first reference voltage REFP 416 and the second reference voltage REFM 418 is sampled on a bottom side of the set of reference capacitor CR1 and CR2 respectively.

Also, in the differential phase, the common switches SC1 and SC2, and the terminal switches ST1, ST2 and ST3 are activated. Thus, the common mode voltage VCM 408 is sampled on a top side of the input capacitors CI1, CI2 and the reference capacitors CR1 and CR2. Thereafter, in the differential phase, the first shorting switch SS1 and the second shorting switch SS3 is activated. The terminal switches ST1 and ST3 remain activated. The common switches SC1, SC2 and the terminal switch ST2 are inactivated. A first voltage is generated at the first node N1 of the threshold detector 410, and a second voltage is generated at the second node N2 of the threshold detector 410. A threshold detector trigger (a positive edge trigger) is generated and the threshold detector 410 compares the first voltage and the second voltage to generate the first digital output. The first digital output from each comparator of the plurality of comparators form the coarse output In the common-mode phase, the first shorting switch SS2 and the second shorting switch SS4 are activated. Also, the terminal switch ST2 is activated. All other switches in the comparator 400 remains inactivated. This generates the common mode voltage VCM 408 at the first node N1 and the second node N2. Thereafter, the reference switches SR1 and SR4, and level-shift switches SL1 and SL2 are activated, and the terminal switch ST2 is inactivated. The second reference voltage REFM 418 is provided to the bottom side of reference capacitors CR1 and CR2. Thus, a third voltage generated at the second node N2.

Also, the first level-shift voltage VL1 412 is provided to the bottom side of the input capacitor CI1, and the second level-shift voltage VL2 414 is provided to the bottom side of the input capacitor CI2. Thus, a fourth voltage generated at the first node N1. A threshold detector trigger (a positive edge trigger) is generated and the threshold detector 410 compares the third voltage generated at the second node N2 and the fourth voltage generated at the first node N1 to generate a second digital output. The second digital output from each comparator of the plurality of comparators forms the common mode signal. Thus, both differential signal and the common mode signal are generated using the comparator 400.

FIG. 6 illustrates a comparator 600, according to an embodiment. The comparator 600, in one example, is a comparator of the plurality of comparators in the first ADC 306. The first ADC 306 may include one or more comparators similar to comparator 600. The comparator 600 receives a first input VA 602 and a second input VB 604. The comparator 600 also receives a first reference voltage REFP 616, a second reference voltage REFM 618, a third reference voltage REF3 606 and a fourth reference voltage REF4 608. The first input VA 602 and the second input VB 604 are similar to the first input VA 302 and the second input VB 304 respectively The comparator 600 also includes a set of input capacitors represented as CI1 and CI2. In one example, a capacitance of CI1 and CI2 is equal. The comparator 600 also includes a set of input switches represented as SI1 and SI2, a set of reference switches represented as SR1, and SR2, a first shorting switch SS1 and a second shorting switch SS2. The comparator 600 also includes a set of common switches represented as SC1 and SC2.

The input switch SI1 receives the first input VA 602, and the input switch SI2 receives the second input VB 604. The set of input capacitors (CI1, CI2) are coupled to the set of input switches (SI1, SI2). The common switch SC1 is coupled in parallel to the input switch SI1, and receives the third reference voltage REF3 606. The common switch SC2 is coupled in parallel to the input switch SI2, and receives the fourth reference voltage REF4 608.

The reference switches SR1 and SR2 receives the first reference voltage REFP 616 and the second reference voltage REFM 618 respectively. The first shorting switch SS1 is coupled to the set of input switches (SI1, SI2). The second shorting switch SS2 is coupled to the set of reference switches (SR1, SR2). The comparator 600 includes a threshold detector 610 that is coupled to the set of input capacitors (CI1, CI2).

A first node N1 of the threshold detector 610 is coupled to the input capacitor CI1, and a second node N2 of the threshold detector 610 is coupled to the input capacitor CI2. A third node N3 is coupled between the input capacitor CI1 and the input switch SI1. A fourth node N4 is coupled between the input capacitor CI2 and the input switch SI2.

The first shorting switch SS1 is coupled between the third node N3 and a fourth node N4. The second shorting switch SS2 is coupled between the first node N1 and the second node N2. The input switch SI1 is coupled to the third node N3 and receives the first input VA 602. The input switch SI2 is coupled to the fourth node N4 and receives the second input VB 604. The common switch SC1 is coupled to the third node N3 and receives the third reference voltage REF3 606. The common switch SC2 is coupled to the fourth node N4, and receives the fourth reference voltage REF4 608.

The reference switch SR1 is coupled to the first node N1 and receives the first reference voltage REFP 616. The reference switch SR2 is coupled to the second node N2 and receives the second reference voltage REFM 618. The comparator 600 is one of the many ways of implementing a comparator and variations, and alternative constructions are apparent and well within the spirit and scope of the disclosure. The comparator 600 may include one or more additional components known to those skilled in the relevant art and are not discussed here for simplicity of the description.

The operation of the comparator 600 illustrated in FIG. 6 is explained now. The operation of the comparator is explained in connection with the operation of the first ADC 306 illustrated in FIG. 3. The first ADC 306 operates in the differential phase and the common-mode phase. The first ADC 306 includes one or more comparators similar to the comparator 600. Thus, the comparator 600 also operates in the differential phase and the common-mode phase.

The differential phase of the comparator 600 is explained now. The reference switches SR1 and SR2, and the input switches SI1 and SI2 are activated or closed. Thus, the first input VA 602 is sampled on a bottom side of the input capacitor CI1 which is coupled to the third node N3. The second input VB 604 is sampled on a bottom side of the input capacitor CI2 which is coupled to the fourth node N4. The first reference voltage REFP 616 is sampled on the first node N1. The second reference voltage REFM 618 is sampled on the second node N2.

Also, in the differential phase, the first shorting switch SS1 is activated. All the other switches are inactivated. The voltages at different nodes of the comparator 600 is given as $$V_{N3} = V_{N4} = 0.5 * (VA + VB) \tag{16}$$

$$V_{N1} = REFP + \left(\frac{VA + VB}{2} - VA\right) \tag{17}$$

$$V_{N1} = REFP - 0.5 \times (VA - VB) \tag{18}$$

$$V_{N2} = REFM + \left(\frac{VA + VB}{2} - VB\right) \tag{19}$$

$$V_{N2} = REFM + 0.5 \times (VA - VB) \tag{20}$$

where $V_{N1}$ is a voltage at the first node N1 and $V_{N2}$ is a voltage at the second node N2. Similarly, voltages at other nodes of the comparator 600 are defined in equation 16.

The threshold detector 610 compares the voltage at the first node N1 and the voltage at the second node N2 to generate a first digital output. The first digital output is generated by each comparator of plurality of comparators in the first ADC 306. The first digital output from each comparator of the plurality of comparators form the coarse output (similar to the coarse output generated by the first ADC 306).

The common-mode phase of the comparator 600 is explained now. The differential phase is followed by the common-mode phase. In the common-mode phase, the first shorting switch SS1 and the second shorting switch SS2 are activated. All other switches are inactivated. The voltages at different nodes of the comparator 600 is given as $$V_{N3} = V_{N4} = 0.5*(VA+VB) \tag{21}$$

$$V_{N1} = V_{N2} = 0.5*(REFP+REFM) \tag{22}$$

The common switch SC2 is activated and other switches in the comparator 600 are inactivated. The voltages at different nodes of the comparator 600 is given as $$V_{N3} = 0.5*(VA+VB) \tag{23}$$

$$V_{N4} = REF4 \tag{24}$$

$$V_{N1} = 0.5*(REFP+REFM) \tag{25}$$

$$V_{N2} = 0.5*(REF\ P+REFM)+REF4-0.5*(VA+VB) \tag{26}$$

The threshold detector 610 compares the voltage at the first node N1 and the voltage at the second node N2 to generate a second digital output. The second digital output is generated by each comparator of plurality of comparators in the first ADC 306. The second digital output from each comparator of the plurality of comparators form the common mode signal (similar to the common mode signal 310 generated by the first ADC 306).

Thus, with the use of the comparator 600 in the first ADC 306, the circuit 300 is able to generate both the differential signal 330 and the common mode signal 310 using the first ADC 306. The circuit 300 does not require any additional ADC to generate the common mode signal. This reduces an input sampling capacitor of the circuit 300. Also, the circuit 300 requires very less power and area as compared to the circuit 100. The comparator 600 provides a solution for using the first ADC 306 to generate the common mode signal 310, and the common mode signal 310 is generated during the common-mode phase when the pipeline ADC 320 is generating the differential signal 330.

FIG. 7 is a flowchart 700 to illustrate a method of operation of a circuit, according to an embodiment. The flowchart 700 is explained in connection with circuit 300. At step 702, a first ADC generates a coarse output in response to a first input and a second input VB 304 during a differential phase. At step 704, during a common-mode phase, a differential signal is generated from the coarse output, the first input and the second input. Also, in the common-mode phase, the first ADC generates a common mode signal. The differential signal is proportional to a difference in the first input and the second input. The common mode signal is proportional to a sum of the first input and the second input.

A difference in the first input and the second input is compared with a resultant reference voltage during the differential phase. The resultant reference voltage is measured using a first reference voltage and a second reference voltage. A sum of the first input and the second input is compared with the resultant reference voltage during the common-mode phase.

In circuit 300, in the differential phase, the first ADC 306 generates a coarse output in response to the first input VA 302 and the second input VB 304. In the common-mode phase, the pipeline ADC 320 generates a differential signal 330 in response to the coarse output, the first input VA 302 and the second input VB 304. Also, in the common-mode phase, the first ADC 306 generates the common mode signal 310.

A first analog signal is generated in response to the coarse output. The second input is subtracted from the first input to generate a second analog signal. The first analog signal is subtracted from the second analog signal to generate a residue signal. The residue signal is amplified to generate an amplified residue signal. The differential signal is generated in response to the amplified residue signal.

FIG. 8 illustrates a time-of-flight (TOF) system 800, according to an embodiment. The TOF system 800 includes a light source 802, an amplifier 804 and a timing generator 806. The amplifier 804 is coupled to the timing generator 806, and the light source 802 is coupled to the amplifier 804. In one example, the light source 802 is an infrared (IR) light emitting diode (LED) that transmits IR light.

The TOF system 800 includes a pixel array 812. The pixel array 812 includes one or more pixels illustrated as 814. The pixel array 812 is coupled to a circuit 810. Each pixel in the pixel array 812 generates a first input and a second input. The circuit 810 is analogous to the circuit 300 in connection and operation. The circuit 810 includes a coarse ADC and a pipeline ADC. The circuit 810 operates in a differential phase and a common-mode phase. In the differential phase, the first ADC generates a coarse output in response to the first input and the second input. In the common-mode phase, the pipeline ADC generates a differential signal in response to the coarse output, the first input and the second input. Also, in the common-mode phase, the first ADC generates a common mode signal.

A processing device 820 is coupled to the circuit 810. The processing device 820 processes the differential signal and the common mode signal. The processing device 820 can be, for example, a CISC-type (Complex Instruction Set Computer) CPU, RISC-type CPU (Reduced Instruction Set Computer), or a digital signal processor (DSP).

The timing generator 806 generates a clock frequency. The light source 802 emits light pulses at the clock frequency. The light pulses emitted by the light source 802 are reflected from a target 815 to generate reflected light pulses. The pixel array 812 receives the reflected light pulses. The processing device 820 generates an image based on the reflected light pulses received by the pixel array 812.

The foregoing description sets forth numerous specific details to convey a thorough understanding of the invention. However, it will be apparent to one skilled in the art that the invention may be practiced without these specific details. Well-known features are sometimes not described in detail in order to avoid obscuring the invention. Other variations and embodiments are possible in light of above teachings, and it is thus intended that the scope of invention not be limited by this Detailed Description, but only by the following Claims.

What is claimed is:

1. A circuit comprising:
   a first analog to digital converter (ADC) configured to generate a coarse output in response to a first input and a second input, the first ADC configured to generate the coarse output in a differential phase; and
   a pipeline ADC configured to generate a differential signal in response to the coarse output, the first input and the second input, the pipeline ADC configured to generate the differential signal in a common-mode phase, wherein the first ADC is configured to generate a common mode signal in the common-mode phase.

2. The circuit of claim 1, wherein the differential signal is proportional to a difference in the first input and the second input.

3. The circuit of claim 1, wherein the common mode signal is proportional to a sum of the first input and the second input.

4. The circuit of claim 1, wherein the pipeline ADC in the common-mode phase is configured to receive the coarse output, the first input and the second input, and configured to generate the differential signal in response to the coarse output, the first input and the second input.

5. The circuit of claim 1, wherein the pipeline ADC comprises:
   a digital to analog converter (DAC) configured to generate a first analog signal in response to the coarse output;
   a first subtractor configured to subtract the second input from the first input to generate a second analog signal;
   a second subtractor configured to subtract the first analog signal from the second analog signal to generate a residue signal;
   an amplifier configured to amplify the residue signal to generate an amplified residue signal; and
   a second ADC configured to generate the differential signal in response to the amplified residue signal.

6. The circuit of claim 1, wherein the first ADC includes a plurality of comparators, and during the differential phase, a comparator of the plurality of comparators is configured to compare a difference in the first input and the second input with a resultant reference voltage, the resultant reference voltage is measured using a first reference voltage and a second reference voltage.

7. The circuit of claim 6, wherein during the common-mode phase, a comparator of the plurality of comparators is configured to compare a sum of the first input and the second input with the resultant reference voltage.

8. The circuit of claim 6, wherein at least one comparator of the plurality of comparator comprises:
   a set of input switches configured to receive the first input and the second input;
   a set of input capacitors coupled to the set of input switches;
   a set of level-shift switches coupled in parallel to the input switches, and configured to receive a first level shift voltage and a second level shift voltage;
   a set of reference switches configured to receive the first reference voltage and the second reference voltage;
   a set of reference capacitors coupled to the set of reference switches;
   a set of first shorting switches configured to couple the set of input capacitors;
   a set of second shorting switches configured to couple the set of reference capacitors;
   a set of common switches configured to receive a common mode voltage;
   a set of terminal switches coupled to the set of reference capacitors and the set of input capacitors; and
   a threshold detector coupled to the set of terminal switches and the set of common switches.

9. The circuit of claim 6, wherein at least one comparator of the plurality of comparator comprises:
   a set of input switches configured to receive the first input and the second input;
   a set of input capacitors coupled to the set of input switches;
   a set of common switches coupled in parallel to the input switches, and configured to receive a third reference voltage and a fourth reference voltage;
   a set of reference switches configured to receive a first reference voltage and a second reference voltage;
   a first shorting switch configured to couple the set of input switches;
   a second shorting switch configured to couple the set of reference switches; and
   a threshold detector coupled to the set of input capacitors.

10. A method comprising:
    generating a coarse output by a first analog to digital converter (ADC) from a first input and a second input during a differential phase; and
    generating a differential signal from the coarse output, the first input and the second input during a common-mode phase, wherein a common mode signal is generated by the first ADC during the common-mode phase.

11. The method of claim 10 further comprising:
    generating a first analog signal in response to the coarse output;
    subtracting the second input from the first input to generate a second analog signal;
    subtracting the first analog signal from the second analog signal to generate a residue signal;
    amplifying the residue signal to generate an amplified residue signal; and
    generating the differential signal in response to the amplified residue signal.

12. The method of claim 10, wherein the differential signal is proportional to a difference in the first input and the second input, and the common mode signal is proportional to a sum of the first input and the second input.

13. The method of claim 10, wherein the first ADC includes a plurality of comparators.

14. The method of claim 10 further comprising comparing a difference in the first input and the second input with a resultant reference voltage during the differential phase, wherein the resultant reference voltage is measured using a first reference voltage and a second reference voltage.

15. The method of claim 10, wherein at each comparator of the plurality of comparators, during the differential phase:
sampling the first input and the second input on a bottom side of a set of input capacitors;
sampling the first reference voltage and the second reference voltage on a bottom side of a set of reference capacitors;
sampling a common mode voltage on a top side of the set of input capacitors and a top side of the set of reference capacitors;
shorting the bottom side of the set of input capacitors and shorting the bottom side of the set of reference capacitors to generate a first voltage at a first node of a threshold detector and a second voltage at a second node of the threshold detector, the threshold detector is coupled to the set of input capacitors and the set of reference capacitors; and
comparing the first voltage and the second voltage to generate a first digital output.

16. The method of claim 10, wherein at each comparator of the plurality of comparators during the common-mode phase:
shorting the top side of the set of input capacitors and the top sides of the reference capacitors to generate the common mode voltage at the first node and the second node of the threshold detector;
providing a first level-shift voltage and a second level-shift voltage on the bottom side of the set of input capacitors to generate a third voltage at the first node of the threshold detector;
providing the first reference voltage and the second reference voltage on the bottom side of the set of reference capacitors to generate a fourth voltage at the second node of the threshold detector; and
comparing the third voltage and the fourth voltage to generate a second digital output.

17. The method of claim 10, wherein the first digital output from each comparator of the plurality of comparator form the coarse output, and the second digital output from each comparator of the plurality of comparators form the common mode signal.

18. The method of claim 10 further comprising comparing a sum of the first input and the second input with the resultant reference voltage during the common-mode phase.

19. A time-of-flight (TOF) system comprising:
a light source for emitting light pulses;
a pixel array having a plurality of pixels arranged in a plurality of rows and a plurality of columns; and
a circuit coupled to the pixel array, the circuit configured to receive a first input and a second input from each pixel in the pixel array, the circuit comprising
a first analog to digital converter (ADC) configured to generate a coarse output in response to the first input and the second input, the first ADC configured to generate the coarse output in a differential phase; and
a pipeline ADC configured to generate a differential signal in response to the coarse output, the first input and the second input, the pipeline ADC configured to generate the differential signal in a common-mode phase, wherein the first ADC is configured to generate a common mode signal in the common-mode phase.

20. The TOF system of claim 19 further comprising a processor coupled to the circuit, and configured to process the differential signal and the common mode signal.

* * * * *